United States Patent [19]

Iversen

[11] Patent Number: 5,003,376
[45] Date of Patent: Mar. 26, 1991

[54] COOLING OF LARGE HIGH POWER SEMI-CONDUCTORS

[75] Inventor: Arthur H. Iversen, Saratoga, Calif.

[73] Assignee: Coriolis Corporation, Saratoga, Calif.

[21] Appl. No.: 549,239

[22] Filed: Jul. 6, 1990

Related U.S. Application Data

[63] Continuation of Ser. No. 329,857, Mar. 28, 1989, abandoned.

[51] Int. Cl.⁵ .................. H01L 25/04; H05K 7/20
[52] U.S. Cl. .................................. 357/82; 357/75; 361/385; 165/80.3
[58] Field of Search .................. 357/82, 75, 76; 165/80.3; 361/385, 381, 382, 383

[56] References Cited

U.S. PATENT DOCUMENTS

| | | | |
|---|---|---|---|
| 2,501,331 | 3/1950 | Hein | 175/366 |
| 3,573,569 | 4/1971 | Davis | 317/234 |
| 3,993,123 | 11/1976 | Chu et al. | 165/80 |
| 4,712,609 | 12/1987 | Iversen | 165/80.4 |

FOREIGN PATENT DOCUMENTS 2033668  5/1980  United Kingdom ............... 361/382

Primary Examiner—Andrew J. James
Assistant Examiner—Don Monin
Attorney, Agent, or Firm—Foley & Lardner

[57] ABSTRACT

There is disclosed a liquid cooled high power semi-conductor structure comprising multiple stacked semi-conductor devices each having at least one surface prepared with a heat transfer surface having a low thermal resistance whereby heat generated in said semi-conductor device may be readily transported through said opposing heat transfer surface to a liquid coolant, there further being a conduit for the directing of the flow of said coolant, there being multiple semi-conductor devices stacked with heat exchange surfaces of adjacent or semi-conductor devices opposing each other, said heat exchange surfaces being spaced apart to form a coolant conduit, the several coolant conduits being fed coolant in parallel by a common input conduit and the discharge coolant feeding in parallel into a common discharge conduit, said stacked semi-conductor devices being electrically connected in series or some combination of series parallel.

9 Claims, 3 Drawing Sheets

COOLING OF LARGE HIGH POWER SEMI-CONDUCTORS

This is a continuation of application Ser. No. 07/329,857 filed Mar. 28, 1989, abandoned.

TECHNICAL FIELD

The present invention relates to boiling heat transfer and particularly concerns means for the efficient cooling of high power semi-conductor devices.

BACKGROUND OF THE INVENTION

The need for more efficient heat removal from power semi-conductor devices has become more important as power levels increase. The need exists for semi-conductor heat removal structures that can handle higher heat fluxes, are more compact and less costly.

SUMMARY OF THE INVENTION

The present invention provides for the efficient cooling of high power semi-conductor devices.

The present invention provides for the efficient cooling of stacked high voltage high power semi-conductor devices.

The present invention provides for uniform junction temperatures of high power semi-conductor devices independent of environment or location.

The present invention provides for the efficient cooling of high power semi-conductor devices mounted in a compact cost effective structure that is liquid tight.

DESCRIPTION OF THE PREFERRED EMBODIMENT

Figure 1:
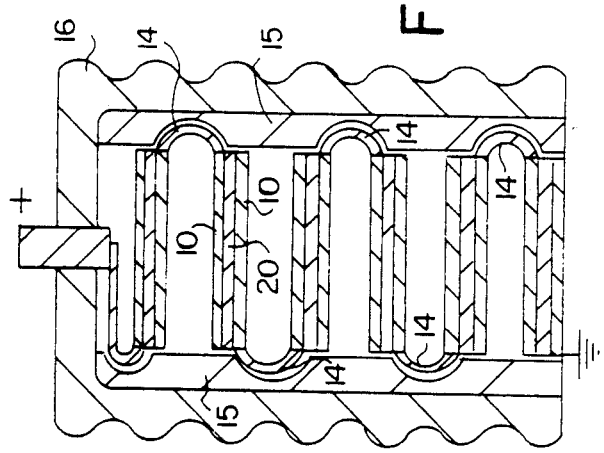
FIG. 1 is a cross-section view showing coolant flow over stacked semi-conductor devices in a housing employing linear flow cooling.

Referring now to FIG. 1, shown is power semi-conductor devices 20 with low thermal resistance members 10 joined in intimate thermal contact, over substantially the entirely of each surface 11 of device 20. In this manner heat may be drawn approximately uniformly from both surfaces 11 of device 20 providing for more efficient heat removal than from semi-conductor devices designed for heat removal from one surface. For high power devices such as Thyristors, GTO's etc. hereinafter sometimes called power devices or devices, device dimensions may be as large as 10 cm in diameter. Efficient operation may be achieved as shown in FIG. 1 wherein individual semi-conductor devices 20 and their attached low thermal resistance heat removal members 10 are positioned as shown with heat exchange surfaces 12 of member 10 opposing each other. Opposing member 10 heat exchange surfaces 12 define conduit 13 for the flow of coolant 36. Heat exchange surfaces 12 are shown as linear, eg. planar. In nucleate boiling heat transfer on linear heat exchange surfaces the heat flux removed, $q \sim (V)^{\frac{1}{2}}$, where v is the coolant velocity. Though not as efficient as concave curved heat exchange surfaces where the heat flux removed $q \sim v$, linear surfaces are competitive for heat fluxes up to about 150 W/cm$^2$ and may be economically useful up to about 300W/cm$^2$. At higher heat fluxes, concave curved surface cooling offers benefits in terms of higher heat fluxes removed at lower pump power, pressure drop and coolant flow rates.

Coolant flow 36 flows up input conduit 37 and in parallel feeds into the several heat exchange conduits 13. Upon passing over heat exchange surfaces 12 of members 10, the coolant discharges into discharge conduit 39 and thence out to an external heat exchanger (not shown) and again returned to input conduit 37. As shown in FIG. 1, compact three dimensional packaging is achieved.

Figure 2:
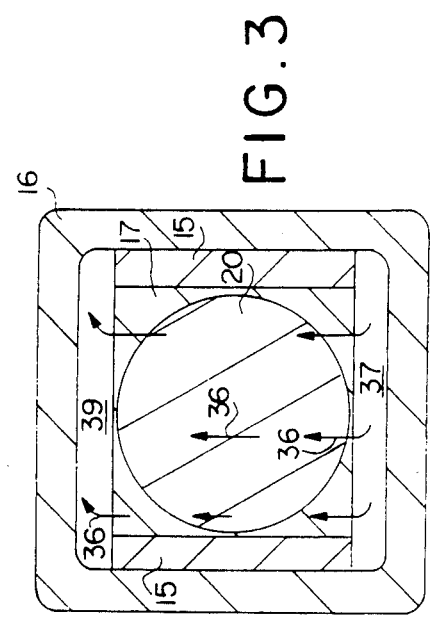
FIG. 2 is a cross-section view orthogonal to coolant flow of stacked semi-conductor devices in a housing employing linear flow cooling.

In FIG. 2, a cross-section orthogonal to coolant flow is shown illustrating series electrical connection 14 between power devices 20. Though series connections are shown, series-parallel connections may be employed to meet higher current requirements. Support means 15 are provided on both sides of devices 20 to provide centering within insulator housing 16 and precise spacing between the several devices 20. Insulator housing 16, of approximately rectangular cross-section, may be made of a suitable dielectric material such as ceramic, e.g. alumina, plastic, e.g. epoxy, or glass. For public utility use voltages of 100 KV and currents of several thousand amperes are not unusual. This would require the series or series-parallel connection of a large number of devices 20.

Figure 3:
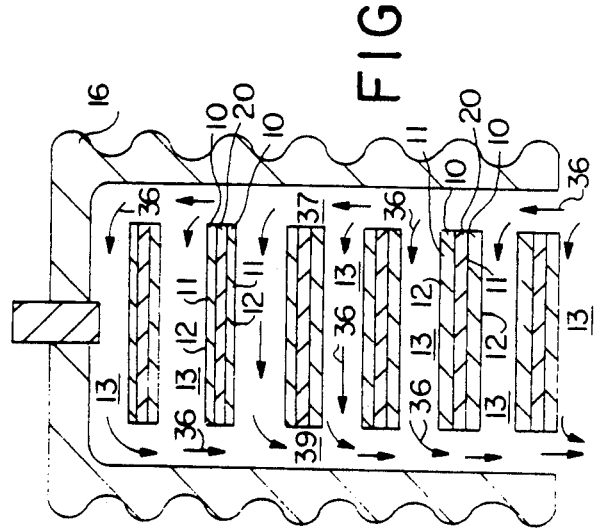
FIG. 3 is a cross-section view seen from the vertical showing housing, semi-conductor devices and coolant flow.

The top view of FIG. 3 illustrates insulator housing 16, coolant flow 36, input 36 and discharge 39 coolant conduits, device 20 support means 15 and conduit extenders 17 which extends coolant conduit 13 geometry to the edge of circular device 20. Should it be desirable, high current buss bars could be placed in the corners of insulator housing 16.

Figure 4:
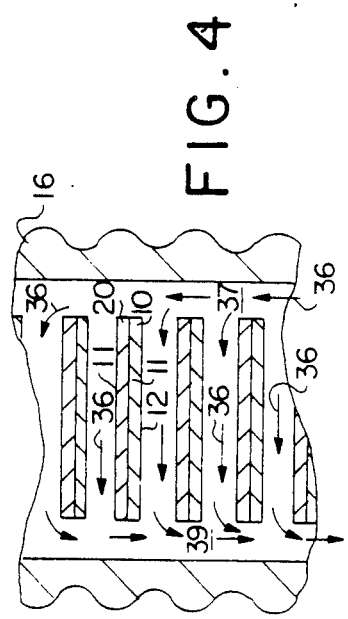
FIG. 4 is a partial cross-section view showing construction of semi-conductor devices each with a thermal resistance member bonded to one side only.

A further embodiment is shown in FIG. 4 wherein a low thermal resistance member 10 is bonded to only one surface 11 of semi-conductor devices 20. In this construction, the opposing surface 11 of semi-conductor device 20 serves as a heat exchange surface. Low thermal resistance member 10 serves as the mounting platform for semi-conductor device 20.

Figure 5:
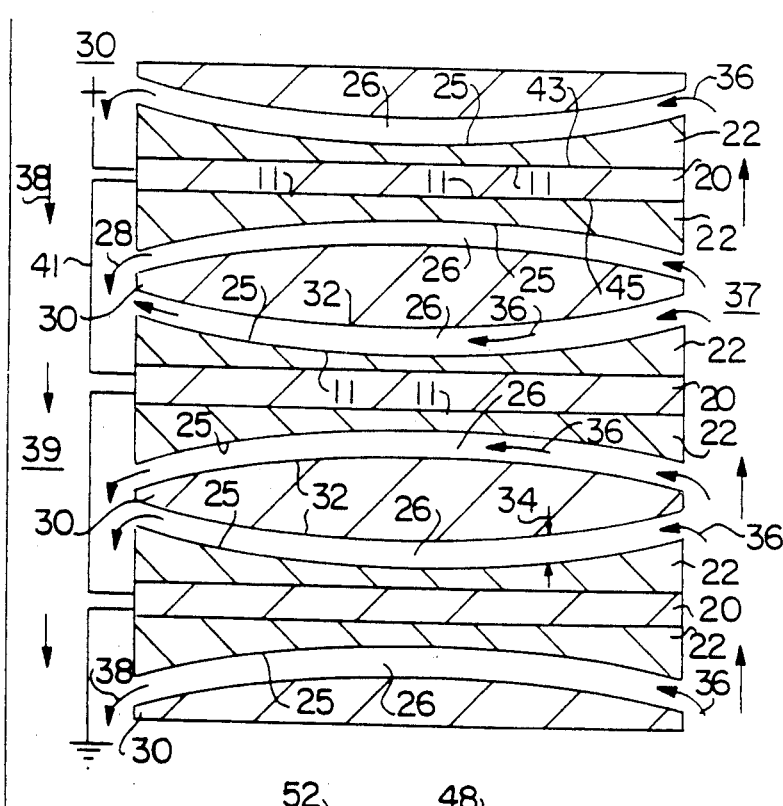
FIG. 5 is a cross-section view of stacked power devices illustrating curved surface cooling.

Curved surface cooling may be employed to good advantage in the stacked electrical series or series-parallel arrangement of semi-conductor devices for combined high power and high voltage. Referring now to FIG. 5, shown are electrical devices compactly arranged and connected electrically in series 41 to obtain high voltage and high current capabilities. Devices 20 have low thermal resistance members 22 fastened in intimate thermal contact, e.g. by brazing, compression bonding, soldering, silver-glass attach etc. to each surface 11 of devices 20. Low thermal resistance member 22 may be, for example, tungsten, silicon carbide or high thermal conductivity silicon, materials whose coefficient of expansion closely matches that of silicon and that also have high thermal conductivities. Alternatively, the GE structured copper method may be employed. To improve the efficiency of cooling, heat exchange surfaces 25 are curved. Subcooled nucleate boiling heat transfer at high heat fluxes is inherently more efficient from a curved surface, where the heat flux removed $q \sim v$ where v is the coolant velocity, as compared to a linear surface cooling where the heat flux removed $q \sim (v)^{\frac{1}{2}}$. In curved surface cooling the centrifugal force generated by coolant flow over concave curved heat exchange surfaces provides significant and beneficial buoyancy forces $v^2/r$, where v is the coolant velocity and r the radius of curvature, which enhance heat transfer. In general, linear flow cooling has a practical upper limit of about 1 KW/cm$^2$ whereas curved surface cooling has demonstrated heat flux removal in excess of 10 KW/cm$^2$. In linear flow, pump power and weight $\sim q^6$, where q is the heat flux, whereas with curved surface flow, it is $\sim q^3$. Thus, to double the heat flux in linear flow requires a 64× increase in pump power and size, whereas in curved surface flow it is only an 8× increase. Thus pump size and pressure requirements are important factors in establishing the practical limits of linear flow cooling. Heat exchange surface 25 of member 22 is shown as concave curved with respect to coolant flow.

Heat generated in power device 20 is transmitted through member 22 to concave curved heat exchange surface 25. Conduit 26 guides flowing coolant 36 over heat exchange surface 25. Septum 30 surfaces 32 and heat exchange surfaces 25 define conduits 26 of height 34. In general, curved surfaces 25 and 32 are approximately cylindrical but may be otherwise curved to optimize heat transfer characteristics.

Figure 6:
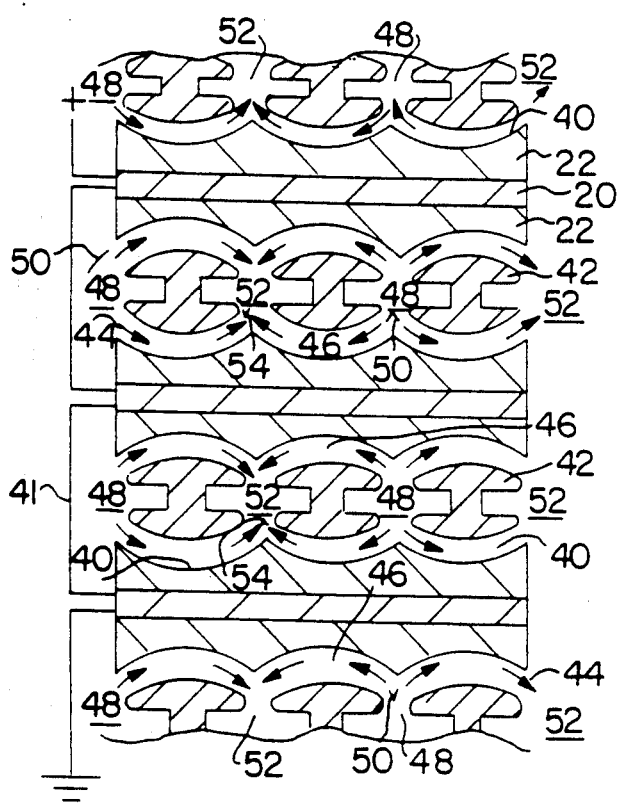
FIG. 6 is cross-section view of stacked power devices of large dimensions illustrating periodic curved surface cooling.

For relatively large devices, that is chip 20 of large dimensions, and at high heat flux levels periodic curved surface cooling may be more advantageous as shown in FIG. 6 Low thermal resistance member 22 is shown with periodic curved surfaces 40. Septum 42 serve to guide coolant flow 44 and define heat exchange conduits 46. Coolant enters through input conduits 48, is caused by flow diverters 50 to smoothly and uniformly, along the length of septum 42, make a 90° turn and flow through heat exchange conduits 46, both upper and lower. After passing over heat exchange surface 40, flow diverters 54 cause the coolant to make a smooth 90° turn into discharge conduits 52. Thus, there is continuous alternate bifurcation of incoming coolant flow into heat exchange conduit 46 from conduit 48 and merging of discharge flow from heat exchange conduit 46 into conduit 52.

Figure 9:
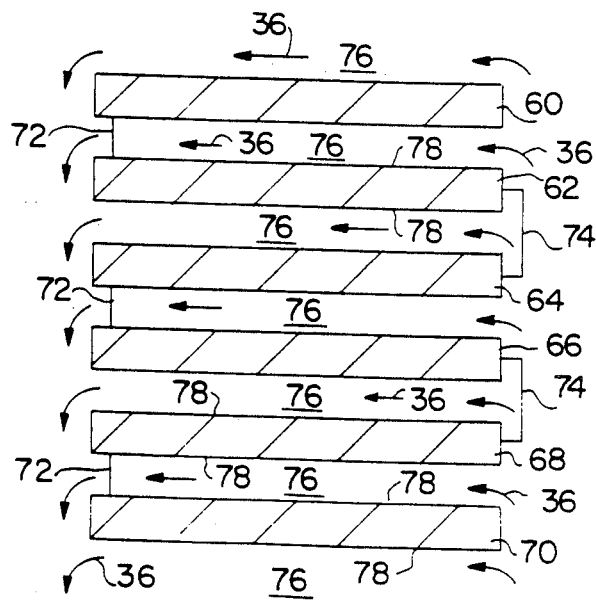
FIG. 9 is a schematic illustration of an electrical series-parallel construction for fail-safe operation.

A preferred embodiment of series-parallel electrical connection of devices 20 is the fail-safe configuration shown schematically in FIG. 9. Device components 60, 52, 54, 66, 68 and 70 each comprising devices 20, and preferably, curved surface low thermal resistance member 22 of FIGS.5 or 6 are stacked as shown is FIG. 9. Components 60 and 62, 64 and 66, 68 and 70 are electrically parallel connected 72. Electrical series connections 74 are then made betwen parallel sub-assemblies 60 and 62, 64 and 66, 68 and 70,. Thus there are three parallel and three seriesed electrical connections. With devices 20 of the same rating the completed structure will have three times the voltage rating and twice the current rating of a single device 20.

Though the linear flow cooling of FIG. 1 may be employed, the more efficient cooling of curved surface flow of FIGS. 5 and 6 may be used to advantage for fail-safe electrical operation. As before, coolant flow 36 removes heat from member heat exchange surfaces 78 (FIG. 9). Coolant flow 36 is such that it is capable of removing at least twice as much heat flux as is required for normal operation. Thus, if one of the devices fails, the remaining device will be required to carry twice the current and with it, twice the dissipated heat flux. Since the coolant flow is set for twice the normal dissipation, operation can continue until repairs can conveniently be made. Though the electrical paralleling of two devices 20 is shown in FIG. 9, more may be placed in parallel to increase the current rating or to reduce the individual device heat load in the event of the failure of one device. This means that a less than doubling of the coolant flow dissipation capability would then be require. Other considerations in an electrical parallel or series-parallel operation include uniform device junction temperatures which are established by the boiling point of the coolant, independent of location or environment. Low device-heat exchange member thermal resistance construction, e.g. 0.1° C/W cm$^2$ combined with low boiling point coolants, e.g. R114(BP4° C.) permit high heat fluxes to be dissipated while maintaining device junction temperatures within safe operating limits. State of the art cooling for power devices is about 150 W/cm$^2$. Curved surface nucleate boiling cooling can easily dissipate 1000 W/cm$^2$ and higher. Thus, the limits on performance will be junction to coolant thermal resistance and coolant boiling point. It is expected that device current ratings can be doubled while leaving a two to one heat flux margin for device failure in parallel operation.

Dielectric coolants, when properly used, though not as efficient as water offer significant advantages including being non-conductive, non-corrosive, no algae growth and selectable boiling point. There are a number of fluorocarbons with desirable boiling points for use as a coolant, e.g. R114, (BP4° C.), R11 (BP24° C.), FC87 (BP32° C.) R113 (BP47° C.) and FC72(BP56° C.). Thus, for a given thermal resistance, fluorocarbon boiling point, and operating power (plus superheat) the device junction temperature can be specified; this temperature being substantially constant from board to board, cabinet to cabinet and room to room independent of location and environment in that the temperature of heat exchange surfaces 12, 25, 40 (FIGS. 1, 5 and 6) is fixed by the boiling point of the coolant. Should a junction temperature intermediate between that available from the pure coolants be desired, coolants can be mixed to obtain an intermediate boiling temperature. For example, if a 40° C. boiling point were desired, an approxiamtely 50%:50% mix of FC87 (BP32° C.) and R113 (BP47° C.) would be made inasmuch as the intermediate boiling point is approximately proportional to the radio of the two liquids. Advantages may be obtained in mixing three or more liquids. To minimize separation of the liquids, characteristics, such as density should be matched as closely as possible. However, with turbulent coolant flow and consequent continuous mixing action, problems such as separation of liquids is minimized as contrasted to pool boiling.

A problem encountered with heat exchange surfaces incorporating dielectric coolants in boiling heat transfer is that of temperature overshoot in that after several on-off power cycles, the nucleating cavities on the heat exchange surface are flooded with coolant, the noncondensable gases normally present in said cavities having been substantially displaced by the low surface tension, low contact angle dielectric liquids. Nucleate boiling heat exchange surfaces using fluorocarbon liquids are especially prone to temperature overshoot. Upon establishment of steady nucleate boiling, the $\Delta T$ superheat returns to its normal value.

Means whereby the temperature overshoot may be reduced include reducing the initiating superheat. This may be accomplished by locally reducing the pressure directly over the reentrant nucleating cavity which in turn initates nucleate boiling at a lower superheat. This pressure reduction may be obtained by causing the coolant streamlines to follow a curved path directly over the cavity thus taking advantage of the Bernoulli effect. Curved coolant streamlines may be induced by protrusions which are preferably part of the cavity geometry. We refer to these as effects as microcurvature effects to distinguish them from the macrocurvature of the curved heat transfer surfaces shown in FIGS. 5 and 6.

Figure 7:
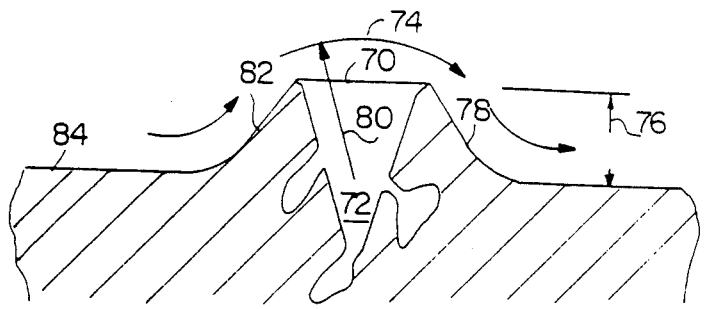
FIG. 7 is a cross-section view of a nucleating site cavity that is designed to minimize temperature overshoot.

In general, the height of the protrusions ranges from about one tenth of the height of the viscous sublayer into the transition zone and, in general, range from 0.001m to 0.5mm. In general, it is desirable to encompass cavity 72 with protrusion 78, the throat 70 of cavity 72 being exposed to coolant flow as shown in FIG. 7. The outer surface of protrusion 78 is shown as approximately concave 82 so as to promote curved streamlines 74. The distribution of reentrant nucleating site cavities 72 and protrusions 78 on heat exchange surface 52 is such so as to obtain optimum heat transfer rates. Cavity dimensions may range from 0.002mm to 0.2mm and cavity-to-cavity spacing may range from 0.03mm to 0.3mm. Other geometries of protrusion 78 may prove optimum depending on coolant parameters such as velocity, density, viscosity, surface tension, temperature etc.

Figure 8:
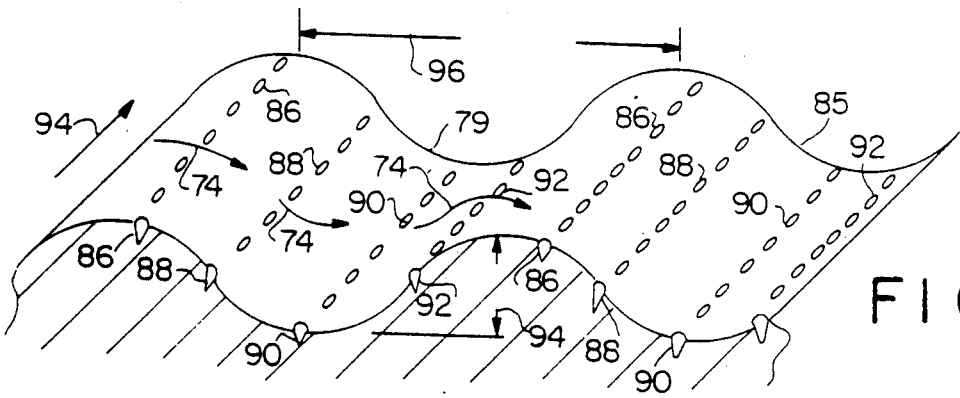
FIG. 8 is a angled view of an undulating surface of small dimensions containing nucleating site cavities designed to minimize temperature overshoot.

A further preferred embodiment to reduce the initiating superheat is shown in FIG. 8. Heat transfer 79, for both curved and linear surfaces of FIGS. 1, 5 and 6, is caused to undulate 85 in the direction of coolant flow 74 with the undulations projecting linearly in the direction 94 orthogonal to coolant flow 74, that is, undulations 85 are elongated in direction 94. For discussion purposes, cavities 86 are shown at the peak of the undulation, cavities 88 on the downstream slop, cavities 90 in the trough and cavities 92 on the upstream slope. In general, cavity distribution will be denser than described above. Coolant streamlines 74 are shown concave over the line of cavities 86 along the peak of undulations 85 thus lowering the presure by the Bernoulli effect and triggering nucleate boiling. Cavities 88 on the downstream side of undulation 85 will experience a lower local pressure drop than cavities 86. Cavities 90 in the trough of undulation 85 will see a small pressure increase while cavities 92 in the upstream surface will see a pressures increase.

Nucleate boiling will commence with cavities 86 which have the lowest pressure over the cavities. The localized intense turbulence generated by the nucleate bubbles combined with the sweep of nucleate bubbles over cavities 88 will trigger nucleate boiling in cavities 88. In the like manner, nucleate boiling will be trigger successively in cavities 90 and then 92. Once nucleate boiling commences with cavities 86, streamlines 74 tend to be broken up and local turbulence at the nucleating sites increasingly predominates. Under these conditions the curved streamlines 74 illustrated in FIGS. 7 and 8 are completely disrupted and the microcurvature effects no longer influence the heat transfer process. Heights 94, that is, peak-to-peak, of the undulating surface 85 may range from 0.001 mm to 0.5 mm and the period 96 of undulations 85 may range from 0.005 mm to 5 mm.

Cavities 72 and related protrusions 78 may be made by a number of methods. For minute cavities and protrusions of micron and sub-micron dimensions with high packing densities Electrical Discharge Texturing (EDT), a variant of Electric Discharge Machining (EDM), may be used. Other methods such as chemical milling or laser drilling may be used for larger cavities and protrusions. Reactive chemicals may be added to the above processes to promote desired protrusion and reentrant cavity geometries during surface preparation.

At the throat 70 of cavity 72 in FIG. 7, the pressure in the liquid is lowered by an amount:

$$\Delta P \sim p\, v^2 h/r$$

where p is the liquid density, v is the coolant velocity 74, h the height 76 of the protrusion 78 and r the radius of microcurvature 80 of the coolant streamlines 74 passing over cavity 72. The streamlines 74 are shown as concave curved with respect to cavities 72. The geometry of the protrusions 78 are much such as to optimize the radius of curvature 80 of the streamlines 74. If the radius of curvature of the streamlines is too small as might occur with a sharp protrusion, the streamlines could break up, vortex shedding could take place etc., thus rendering the protrusions less effective.

It will be understood that the above description is of preferred exemplary embodiments of the present invention and that the invention is not limited to the specific forms shown. Modification may be made in the design and arrangement of the elements without departing from the spirit of the invention as expressed in the appended claim.

I claim:

1. An apparatus for transferring heat from a plurality of semi-conductor devices, comprising:
    a housing including a fluid chamber comprising respective first and second substantially flat, oppositely disposed interior walls and an interior top portion spanning said walls;
    first and second semi-conductor stacks, each comprising:
        a thin, flat semi-conductor device having a top surface and an oppositely disposed bottom surface;
        a first low thermal resistance member intimately bonded to and extending across said top surface of said device; and
        a second low thermal resistance member intimately bonded to and extending across said bottom surface of said device;
    the apparatus being configured such that said first and second stacks and said first interior wall cooperate to define a common input coolant conduit, said first and second stacks and said second interior wall cooperate to define a common discharge conduit, said first low thermal resistance member of said first stack and said interior top portion cooperate to define a first conduit, and said second low thermal resistance member of said first stack and said first low thermal resistance member of said second stack cooperate to define a second conduit, said first and second conduits communicating with said common input and said common discharge conduits to permit fluid flow from said common input conduit to said comon discharge conduit through said first and second conduits;

the apparatus further comprising support means for maintaining said first and second semi-conductor devices substantially parallel to each other such that said first and second stacks, are substantially immersed in the fluid.

2. The apparatus of claim 1, wherein each of said first and second low thermal resistance members comprises a first, substantially flat surface in contact with one of said top and bottom surfaces of one of said semi-conductor devices, and a second, oppositely disposed substantially flat surface defining a portion of one of said first and second conduits.

3. The apparatus of claim 1, further comprising a septum disposed in said second conduit between said first and second semi-conductor stacks, said septum including a first convex surface disposed opposite said first semi-conductor stack and a second convex surface disposed opposite said second semi-conductor stack, wherein:

said second low thermal resistance member of said first semi-conductor stack comprises a substantially flat surface in contact with said bottom surface of said first semi-conductor device and an oppositely disposed concave surface disposed opposite said first convex surface of said septum thereby forming a first curved conduit therebetween;

said first low thermal resistance member of said second semi-conductor stack comprises a substantially flat surface in contact with said top surface of said second semi-conductor device, and an oppositely disposed concave surface disposed opposite said second convex surface of said septum thereby forming a second curved conduit therebetween; and wherein said septum is configured to bifurcate said first conduit into said first and second curved conduits.

4. The apparatus of claim 3, wherein:

said interior top portion of said housing comprises a convex surface disposed opposite said first semi-conductor stack; and said first low thermal resistance member of said first stack comprises a first, substantially flat surface surface in contact with said top surface of said first semi-conductor device, and an oppositely disposed concave surface disposed opposite and convex surface of said interior top portion, such that said first conduit comprises a third curved conduit.

5. The apparatus of claim 1, wherein said fluid comprises a dielectric coolant such that said first and second semi-conductor stacks are substantially electrically insulated from each other and from said housing.

6. The apparatus of claim 1, wherein said housing further comprises respectively oppositely disposed first and second interior support surfaces, and said support means comprises:

a first electrically resistive member secured to said first interior support surface and to said first semi-conductor stack; and a second electrically resistive member secured to one of said first and second support surfaces and to said second semi-conductor stack.

7. The apparatus of claim 1, wherein said first and second low thermal resistance memebrs of said first and second semi-conductor stacks are electrically conductive.

8. The apparatus of claim 6, wherein said first and second low thermal resistance memnbers of said first and second semi-conductor stacks are electrically conductive, and wherein said first electrically resistive member is connected to one of said first and second low thermal resistance member of said first semi-conductor stack, and said second electrically resistive member is connected to one of said first and second low thermal resistance members of said second semi-conductor stack.

9. The apparatus of claim 1, further comprising a plurality of semi-conductor stacks similar to said first and second semi-conductor stacks, disposed within said fluid chamber of said housing at spaced apart intervals and having a plurality of fluid conduits, similar to said second conduit, disposed therebetween.

* * * * *